(12) United States Patent
Chang et al.

(10) Patent No.: US 11,676,877 B2
(45) Date of Patent: Jun. 13, 2023

(54) ELECTRONIC PACKAGE WITH MULTIPLE ELECTRONIC COMPONENTS SPACED APART BY GROOVES

(71) Applicant: Siliconware Precision Industries Co., Ltd., Taichung (TW)

(72) Inventors: Hong-Da Chang, Taichung (TW); Chun-Chang Ting, Taichung (TW); Chi-Jen Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 17/747,900

(22) Filed: May 18, 2022

(65) Prior Publication Data

US 2022/0278013 A1    Sep. 1, 2022

Related U.S. Application Data

(62) Division of application No. 16/734,612, filed on Jan. 6, 2020, now Pat. No. 11,398,413.

(30) Foreign Application Priority Data

Sep. 10, 2019  (TW) .................. 108132528

(51) Int. Cl.
*H01L 23/31*    (2006.01)
*H01L 21/56*    (2006.01)

(52) U.S. Cl.
CPC ........ *H01L 23/3178* (2013.01); *H01L 21/563* (2013.01)

(58) Field of Classification Search
CPC .................................................. H01L 23/3178
USPC .......................................................... 257/778
See application file for complete search history.

(56) References Cited

U.S. PATENT DOCUMENTS

| | | | |
|---|---|---|---|
| 2002/0060084 A1* | 5/2002 | Hilton | ..................... H01L 24/32 |
| | | | 257/E21.503 |
| 2002/0090162 A1 | 7/2002 | Asada | |
| 2016/0276176 A1 | 9/2016 | Kamphuis | |
| 2017/0213809 A1* | 7/2017 | Lu | ........................... H01L 24/94 |

* cited by examiner

*Primary Examiner* — Ajay Arora
(74) *Attorney, Agent, or Firm* — Kelly & Kelley, LLP

(57) ABSTRACT

A method for fabricating an electronic package is provided. A filling material is formed in an interval S, at which a plurality of electronic components disposed on a carrying structure are spaced apart from one another. The filling material acts as a spacer having a groove, and the groove acts as a stress buffering region. Therefore, the electronic components can be prevented from being broken due to stress concentration.

9 Claims, 5 Drawing Sheets

ELECTRONIC PACKAGE WITH MULTIPLE ELECTRONIC COMPONENTS SPACED APART BY GROOVES

RELATED APPLICATIONS

This application is a Divisional of U.S. application of Ser. No. 16/734,612, filed Jan. 6, 2020, which claims priority to Taiwanese Application Serial No. 108132582, filed on Sep. 10, 2019. The entirety of the application is hereby incorporated by reference herein and made a part of this specification.

BACKGROUND OF THE INVENTION

1. Technical Field

The present disclosure relates to semiconductor devices, and, more particularly, to an electronic package and a method for fabricating the same.

2. Description of the Prior Art

With the rapid development of electronic industry, modern electronic products are designed to be compact, low-profiled and have a variety of functions. Semiconductors can be packaged in various manners. For example, semiconductors can be packaged in a flip-chip manner to increase their routing density and meet the high integration and miniaturization requirements.

FIG. 1 is a cross-sectional view of a flip-chip package structure 1 according to the prior art. A semiconductor chip 11 is bonded via a plurality of solder bumps 13 to a packaging substrate 10. The solder bumps 13 are reflowed. Then, an underfill 14 is formed between the semiconductor chip 11 and the packaging substrate 10 and encapsulates the solder bumps 13.

When the package structure 1 is packaged, the underfill 14 is likely to be formed in the corners or on an edge of an inactive surface of the semiconductor chip 11. Since the underfill 14 has a relatively great Young's modulus, the semiconductor chip 11 has a high inner stress. Accordingly, the stress of the semiconductor chip 11 will be concentrated, the semiconductor chip 11 is likely to be broken, and the package structure 1 has poor reliability.

Therefore, how to overcome the drawbacks of the prior art is becoming an urgent issue in the art.

The present invention fulfills these needs and provides other related advantages.

SUMMARY OF THE INVENTION

In view of the drawbacks of the prior art, the present disclosure provides an electronic package, comprising: a carrying structure; a first electronic component and a second electronic component disposed on the carrying structure and spaced apart from each other at an interval; a filling material formed in the interval and acting as a spacer having a groove; and an active layer formed in the groove.

The present disclosure further provides a method for fabricating an electronic package, comprising: disposing on a carrying structure a first electronic component and a second electronic component spaced apart from each other at an interval; forming in the interval a filling material that acts as a spacer, and forming in the spacer a groove; and forming an active layer in the groove.

In an embodiment, the first electronic component and the second electronic component are electrically connected to the carrying structure.

In an embodiment, the first electronic component and the second electronic component are in the same type or different types.

In an embodiment, the first electronic component and the second electronic component have upper surfaces being flush with an upper surface of the active layer.

In an embodiment, the first electronic component and the second electronic component have upper surfaces being flush with an upper surface of the spacer.

In an embodiment, the groove has a width being constant from an opening of the groove to a bottom of the groove.

In an embodiment, the groove has a width being inconstant from an opening of the groove to a bottom of the groove.

In an embodiment, the filling material is further formed between the carrying structure and the first electronic component and between the carrying structure and the second electronic component.

In an embodiment, the active layer has a Young's modulus less than a Young's modulus of the filling material.

In an embodiment, the groove has a lateral wall extending to the first electronic component and/or the second electronic component.

In the electronic package and the method for fabricating the same according to the present disclosure, the groove is formed in the filling material formed between the first electronic component and the second electronic component, and the spacer acts as a stress buffering region. Compared with the prior art, the present disclosure can prevent the first electronic component and the second electronic component from being broken due to stress concentration.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the invention. In such drawings:

FIG. 2C' is an enlarged view of a portion of FIG. 2C;

FIG. 2D' is a schematic diagram of another embodiment of FIG. 2D;

FIG. 3' is a cross-sectional view of another embodiment of FIG. 3.

DETAILED DESCRIPTION OF THE PREFERRED EMBODIMENTS

Figure 1:
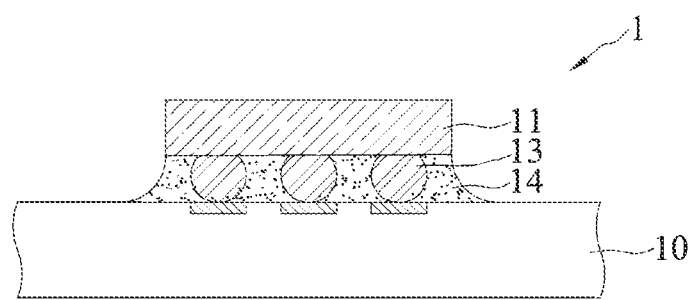
FIG. 1 is a cross-sectional view of a flip-chip package structure according to the prior art.

The following illustrative embodiments are provided to illustrate the disclosure of the present disclosure, these and other advantages and effects can be apparently understood by those in the art after reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "over," "first," "second," "one," and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2D are cross-sectional views illustrating a method for fabricating an electronic package 2 according to the present disclosure.

Figure 2A:
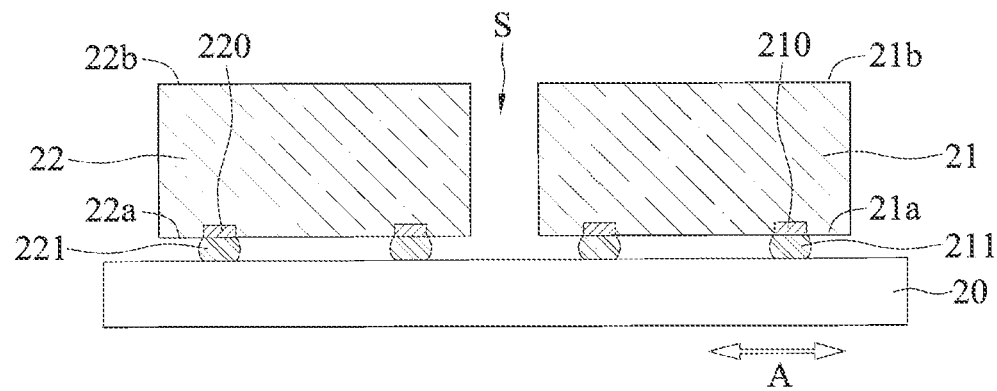
FIGS. 2A to 2D are cross-sectional views illustrating a method for fabricating an electronic package according to the present disclosure.

As shown in FIG. 2A, at least one first electronic component 21 and at least one second electronic component 22 are disposed on a carrying structure 20 along a horizontal direction A and spaced apart from each other at an interval S.

In an embodiment, the carrying structure 20 is a packaging substrate having a core layer and a circuit structure, or a coreless circuit structure, such as a redistribution layer (RDL). In another embodiment, the carrying structure 20 is a semiconductor substrate having a plurality of through-silicon vias (TSV) and act as a through silicon interposer (TSI). In yet another embodiment, the carrying structure 20 is a carrying unit, such as a leadframe, for carrying an electronic component, such as a chip.

In an embodiment, the first component 21 is an active element, such as a semiconductor chip, a passive element, such as a resistor, a capacitor and an inductor, a package structure, or a combination thereof. In another embodiment, the first electronic component 21 is a semiconductor chip, has an active surface 21a, an inactive surface 21b opposing the active surface 21a, and a plurality of electrode pads 210 disposed on the active surface 21a, and is bonded and electrically connected to the carrying structure 20 in a flip-chip manner via conductive bumps 211 disposed on the electrode pads 210.

In an embodiment, the second electronic component 22 is an active element, such as a semiconductor chip, a passive element, such as a resistor, a capacitor and an inductor, a package structure, or a combination thereof. In another embodiment, the second electronic component 22 is a semiconductor chip, has an active surface 22a, an inactive surface 22b opposing the active surface 22a, and a plurality of electrode pads 220 disposed on the active surface 22a, and is bonded and electrically connected to the carrying structure 20 in a flip-chip manner via conductive bumps 221 disposed on the electrode pads 220.

In an embodiment, the first electronic component 21 and the second electronic component 22 are in the same type (e.g., active elements) and have the same or different internal structures.

In another embodiment, the first electronic component 21 and the second electronic component 22 are in different types. In yet another embodiment, the first electronic component 21 is a package structure, and the second electronic component 22 is an active element.

Figure 2B:
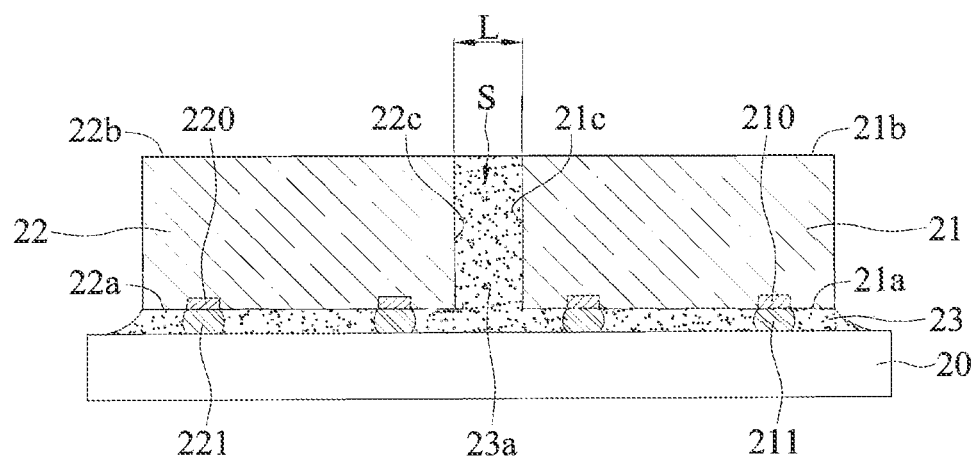

As shown in FIG. 2B, a filling material 23 is formed between the carrying structure 20 and the first electronic component 21 and between the carrying structure 20 and the second electronic component 22, and encapsulates the conductive bumps 211 and 221.

In an embodiment, the filling material 23 is an underfill, and is further formed in the interval S between the first electronic component 21 and the second electronic component 22. In another embodiment, the filling material 23 extends to a lateral surface 21c of the first electronic component 21 and a lateral surface 22c of the second electronic component 22 because of a capillary action, and a spacer 23a composed of the filling material 23 is formed between the first electronic component 21 and the second electronic component 22.

The spacer 23a in the interval S is a block. The smaller the width L of the interval S (i.e., an interval between the first component 21 and the second component 22) or the smaller the interval is, the more obvious the capillary phenomenon of the filling material 23 in the interval S becomes.

The inactive surfaces 21b and 22b of the first component 21 and the second component 22 are flush with an upper surfaces of the spacer 23a.

Figure 2C:
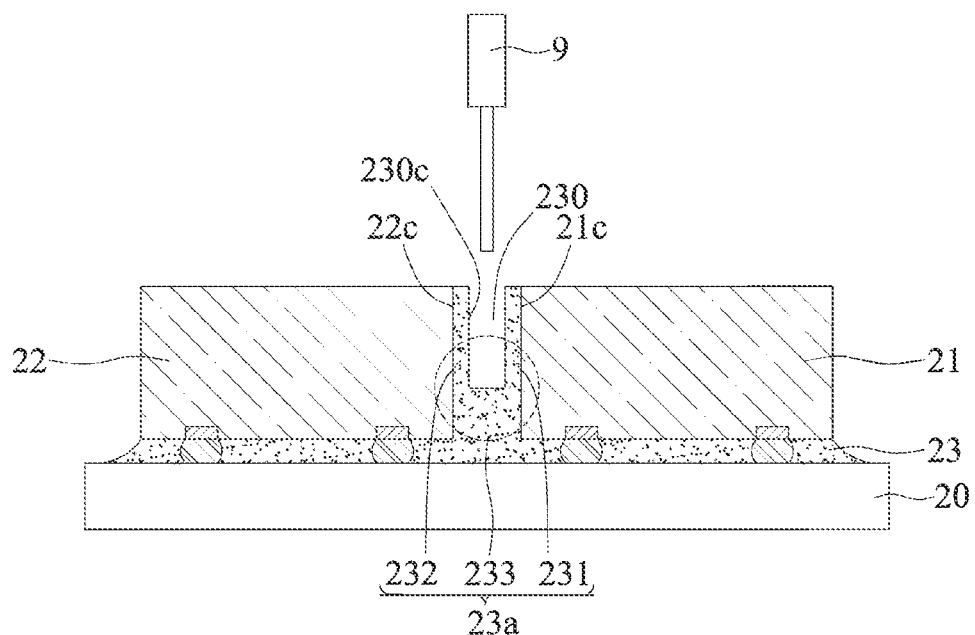
Figure 2C:
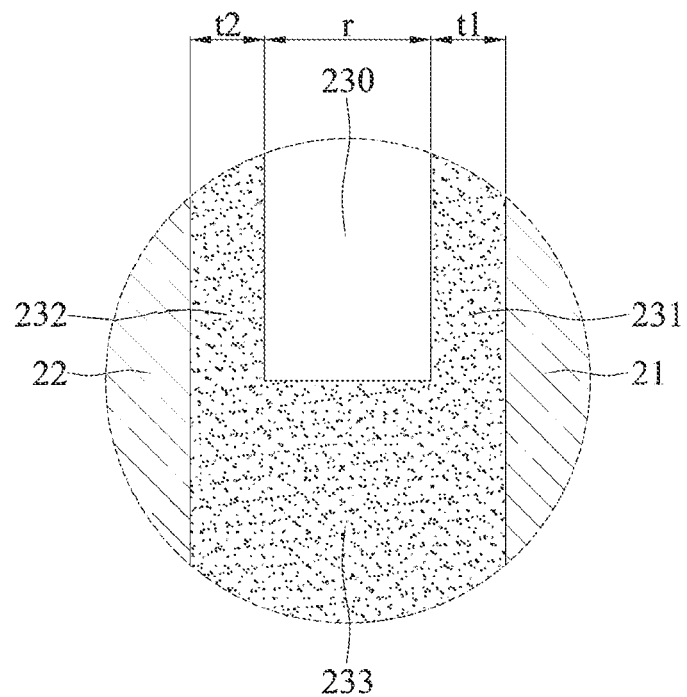

As shown in FIGS. 2C and 2C', at least one groove 230 is formed in the spacer 23a. The spacer 23a comprises a connection block 233 disposed on a bottom of the groove, and a first block 231 and a second block 232 spaced apart from each other and disposed on the connection block 233 (e.g., on different sides of the connection block 233). The first block 231 is bonded to a lateral surface 21c of the first electronic component 21, and the second block 232 is bonded to a lateral surface 22c of the second electronic component 22.

In an embodiment, a portion of the filling material 23 is removed by cutting, laser or etching, to form the groove 230. In an embodiment, the groove 230 has a straight, flat lateral wall 230c. In another embodiment, a cutting tool 9 has a cutting width of 110 μm, and the groove 230 since has a width r that is constant from an opening of the groove 230 to a bottom of the groove 230 (where the connection block 233 is disposed) and is about 110 μm.

The thickness t1 of the first block 231 is the same as or different from the thickness t2 of the second block 232.

Figure 2D:
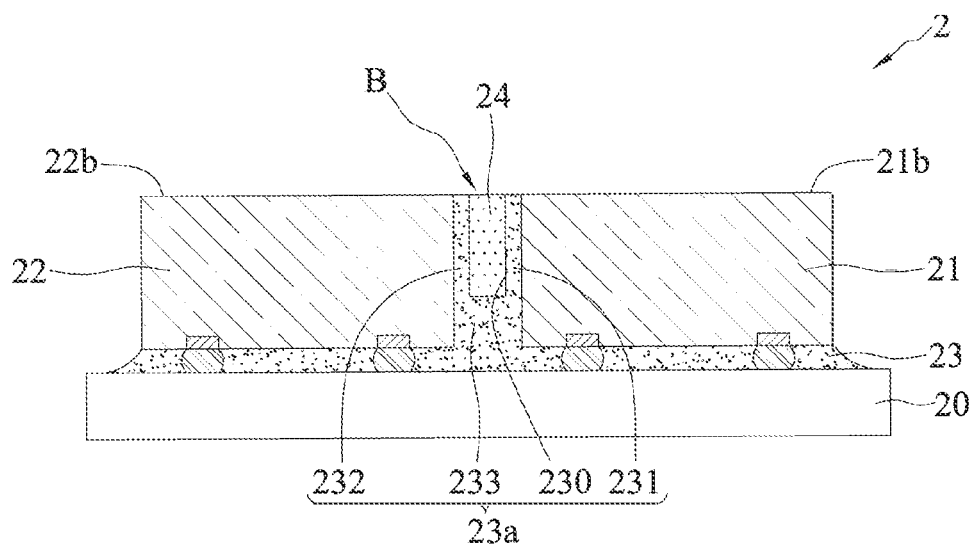
Figure 2D:
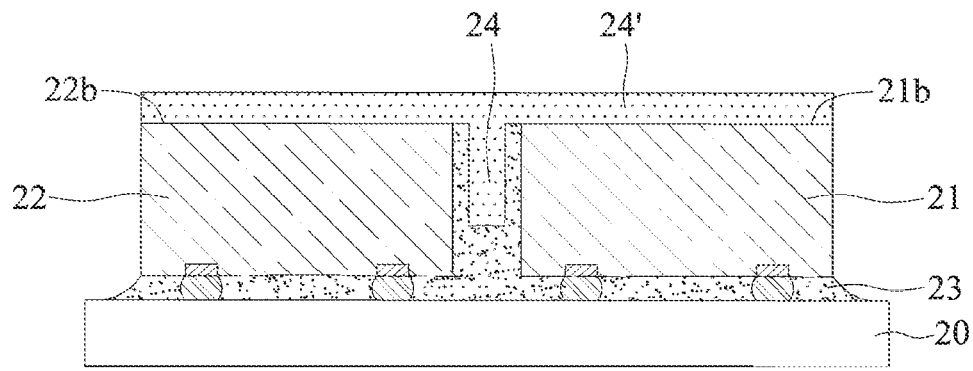

As shown in FIG. 2D, an active layer 24 is formed in the groove 230.

In an embodiment, the active layer 24 fills the groove 230 by lamination or molding.

As shown in FIG. 2D', the active layers 24 and 24' are formed on the inactive surfaces 21b and 22b of the first electronic component 21 and the second electronic component 22, the active layer 24' on the inactive surfaces 21b and 22b is removed by a leveling process or a thinning process, and the inactive surface 21b of the first electronic component 21 and the inactive surface 22b of the second electronic component 22 are coplanar with an upper surface of the active layer 24 in the groove 230. In an embodiment, the active layer 24' covers the inactive surface 21b of the first electronic component 21 and the inactive surface 22b of the second electronic component 22, a portion of the active layers 24 and 24' is removed by polishing or cutting (e.g., a portion of the inactive surface 21b of the first electronic component 21 and a portion of the inactive surface 22b of the second electronic component 22 are removed on demands), and the inactive surface 21b of the first electronic component 21 and the inactive surface 22b of the second electronic component 22 are flush with an upper surface of the active layer 24 in the groove 230.

In an embodiment, the active layer 24 has a Young's modulus less than a Young's modulus of the filling material 23, and is made of an insulation material, such as polyimide (PI), a dry film, epoxy, a molding compound, a photoresist or a solder mask.

Figure 3:
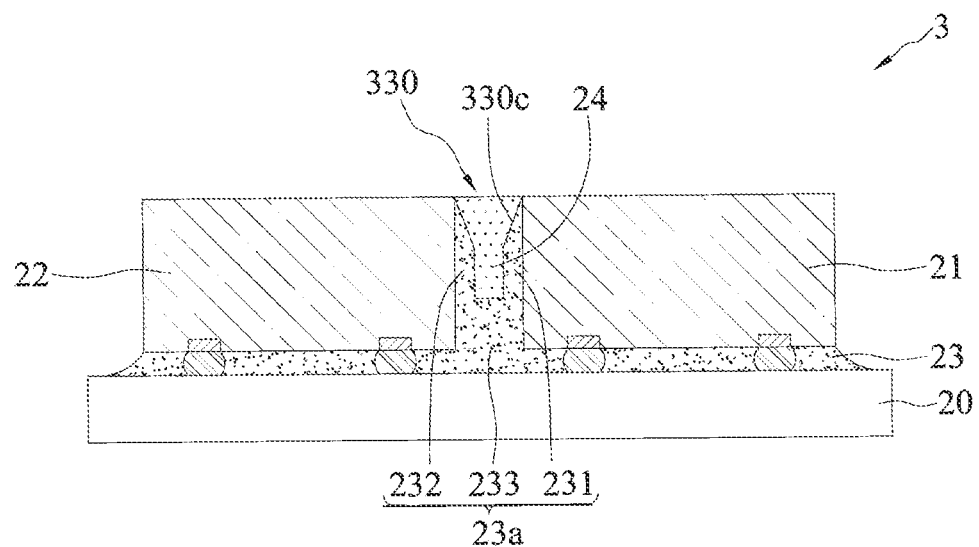
FIG. 3 is a cross-sectional view of another embodiment of FIG. 2D.
Figure 3:
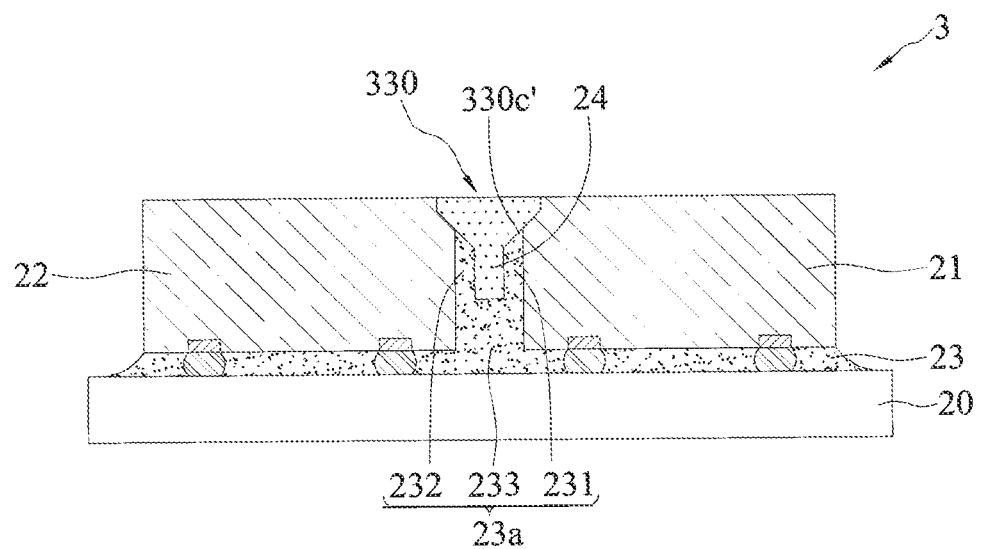

In the electronic package 3 shown in FIG. 3, the groove 330 has a width that is inconstant from the opening of the groove 330 to the bottom of the groove 330. In an embodiment, the groove 330 is in the shape of a cone or a funnel, and has an inclined lateral wall 330c and a width reduced from the opening of the groove 330 to the bottom of the groove 330. With such width variation of the groove 330, the first block 231 and the second block 232 of the spacer 23a form a chamfer structure, and can further reduce the stresses applied on the electronic components. In an embodiment, the lateral wall 330c' of the groove 330 extends to the first electronic component 21 and/or the second electronic component 22, as shown in FIG. 3', and the first electronic component 21 and/or the second electronic component 22 form a chamfer structure in their corners.

In a method for fabricating an electronic package according to the present disclosure, the filling material 23 having the groove 230, 330 is formed in the interval S, the groove 230, 330 can act as a stress buffering region B, and the inner stresses generated by the filling material 23 on the first electronic component 21 and the second electronic component 22 are reduced. Compared with the prior art, the method for fabricating the electronic package according to the present disclosure can distribute the stresses applied to the first electronic component 21 and the second electronic component 22, and prevent the first electronic component 21 and the second electronic component 22 from being broken due to stress concentration.

The present disclosure further provides an electronic package 2, 3, which comprises a carrying structure 20, a first electronic component 21, a second electronic component 22, a filling material 23 and an active layer 24.

The first electronic component 21 and the second electronic component 22 are disposed on the carrying structure 20 and spaced apart from each other at an interval S.

The filling material 23 is formed in the interval S to act as a spacer 23a that has a groove 230, 330.

The active layer 24 is formed in the groove 230, 330.

In an embodiment, the first electronic component 21 and the second electronic component 22 are electrically connected to the carrying structure 20.

In an embodiment, the first electronic component 21 and the second electronic component 22 are in the same or different types.

In an embodiment, the first electronic component 21 and the second electronic component 22 have upper surfaces flush with an upper surface of the active layer 24.

In an embodiment, the first electronic component 21 and the second electronic component 22 have upper surfaces flush with an upper surface of the spacer 23a.

In an embodiment, the groove 230 has a width r constant from an opening of the groove 230 to a bottom of the groove 230.

In an embodiment, the groove 330 has a width reduced from an opening of the groove 330 to a bottom of the groove 330.

In an embodiment, the filling material 23 is further formed between the carrying structure 20 and the first electronic component 21 and between the carrying structure 20 and the second electronic component 22.

In an embodiment, the active layer 24 has a Young's modulus less than a Young's modulus of the filling material 23.

In the electronic package and the method for fabricating the same according to the present disclosure, the groove is formed in the filling material disposed between the first electronic component and second electronic component, and the stresses generated by the filling material in the first electronic component and the second electronic component are reduced. Therefore, the present disclosure can prevent the first electronic component and the second electronic component from being broken, and improve the reliability of the electronic package.

The foregoing descriptions of the detailed embodiments are only illustrated to disclose the features and functions of the present disclosure and are not restrictive of the scope of the present disclosure. It should be understood to those in the art that all modifications and variations according to the spirit and principle in the disclosure of the present disclosure should fall within the scope of the appended claims.

What is claimed is:

1. A method for fabricating an electronic package, comprising:
    disposing on a carrying structure a first electronic component and a second electronic component spaced apart from each other at an interval;
    forming in the interval a filling material acting as a spacer,
    forming in the spacer a groove; such that the spacer comprises a connection block disposed on a bottom of the groove, a first block and a second block spaced apart from each other by the groove and disposed on the connection block, the carrying structure is not exposed by the groove and wherein the first block is bonded to a lateral surface of the first electronic component, and the second block is bonded to a lateral surface of the second electronic component;
    forming an active layer in the groove, wherein the groove has an inclined lateral wall and the first block and the second block of the spacer form a chamfer structure.

2. The method of claim 1, wherein the first electronic component and the second electronic component are electrically connected to the carrying structure.

3. The method of claim 1, wherein the first electronic component and the second electronic component are in a same type.

4. The method of claim 1, wherein the first electronic component and the second electronic component are in different types.

5. The method of claim 1, wherein the first electronic component and the second electronic component have upper surfaces being flush with an upper surface of the active layer and/or an upper surface of the spacer.

6. The method of claim 1, wherein the groove has a width being constant from an opening of the groove to a bottom of the groove.

7. The method of claim 1, wherein the filling material is further formed between the carrying structure and the first electronic component and between the carrying structure and the second electronic component.

8. The method of claim 1, wherein the active layer has a Young's modulus less than a Young's modulus of the filling material.

9. The method of claim 1, wherein the groove has a lateral wall extending to the first electronic component and/or second electronic component.

* * * * *